United States Patent
Ootsuka et al.

(10) Patent No.: US 7,829,898 B2
(45) Date of Patent: Nov. 9, 2010

(54) POWER SEMICONDUCTOR DEVICE HAVING RAISED CHANNEL AND MANUFACTURING METHOD THEREOF

(75) Inventors: Kenichi Ootsuka, Tokyo (JP); Tetsuya Takami, Tokyo (JP); Tadaharu Minato, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 245 days.

(21) Appl. No.: 11/908,530

(22) PCT Filed: Feb. 14, 2006

(86) PCT No.: PCT/JP2006/302516

§ 371 (c)(1),
(2), (4) Date: Sep. 13, 2007

(87) PCT Pub. No.: WO2006/123458

PCT Pub. Date: Nov. 23, 2006

(65) Prior Publication Data

US 2009/0020834 A1 Jan. 22, 2009

(30) Foreign Application Priority Data

May 19, 2005 (JP) ............................. 2005-147088

(51) Int. Cl.
*H01L 29/15* (2006.01)
*H01L 31/0312* (2006.01)
*H01L 29/66* (2006.01)
*H01L 29/02* (2006.01)
*H01L 21/8238* (2006.01)

(52) U.S. Cl. .......................... 257/77; 257/256; 257/328; 257/329; 257/367; 257/402; 257/E29.004; 257/E29.014; 438/199; 438/206; 438/212

(58) Field of Classification Search .................... 257/77, 257/256; 438/199, 206, 212
See application file for complete search history.

(56) References Cited

U.S. PATENT DOCUMENTS 5,561,302 A * 10/1996 Candelaria .................... 257/24

(Continued)

FOREIGN PATENT DOCUMENTS

JP 10-308510 A 11/1996

(Continued)

OTHER PUBLICATIONS

Kumar, R., et al. "A Novel Diffusion Resistant P-Base Region Implanatation for Accumulation-Mode 4H-SiC Epi-Channel Field Effect Transistor", *Extented Abstract of 1999 inter. Conf. On Solid State Devices and Materials*, pp. 146-147.

*Primary Examiner*—N Drew Richards
*Assistant Examiner*—Michael Jung
(74) *Attorney, Agent, or Firm*—Leydig, Voit & Mayer, Ltd.

(57) ABSTRACT

In a MOSFET using SiC a p-type channel is formed by epitaxial growth, so that the depletion layer produced in the p-type region right under the channel is reduced, even when the device is formed in a self-aligned manner. Thus, a high breakdown voltage is obtained. Also, since the device is formed in a self-aligned manner, the device size can be reduced so that an increased number of devices can be fabricated in a certain area and the on-state resistance can be reduced.

8 Claims, 14 Drawing Sheets

U.S. PATENT DOCUMENTS

| | | | |
|---|---|---|---|
| 6,281,521 B1 * | 8/2001 | Singh | 257/77 |
| 6,573,534 B1 | 6/2003 | Kumar et al. | |
| 6,639,273 B1 | 10/2003 | Ueno | |
| 2004/0119076 A1 * | 6/2004 | Ryu | 257/77 |
| 2004/0183079 A1 * | 9/2004 | Kaneko et al. | 257/77 |
| 2006/0057796 A1 * | 3/2006 | Harada et al. | 438/199 |

FOREIGN PATENT DOCUMENTS

| | | |
|---|---|---|
| JP | 2000-150866 A | 5/2000 |
| JP | 2002-270837 A | 2/2002 |
| JP | 2004-363515 A | 12/2004 |
| JP | 2005-33030 A | 2/2005 |

* cited by examiner

F I G . 4
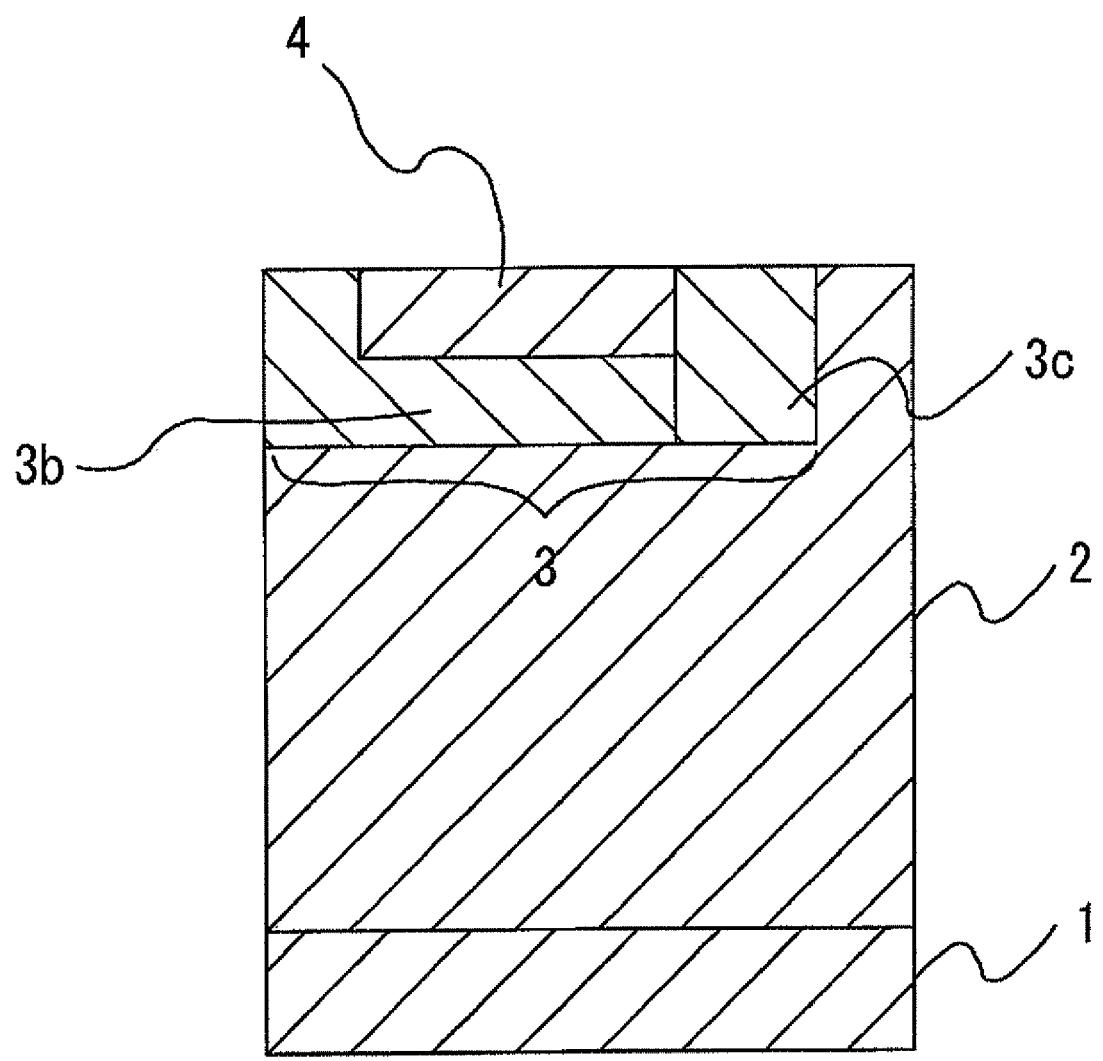

F I G . 7
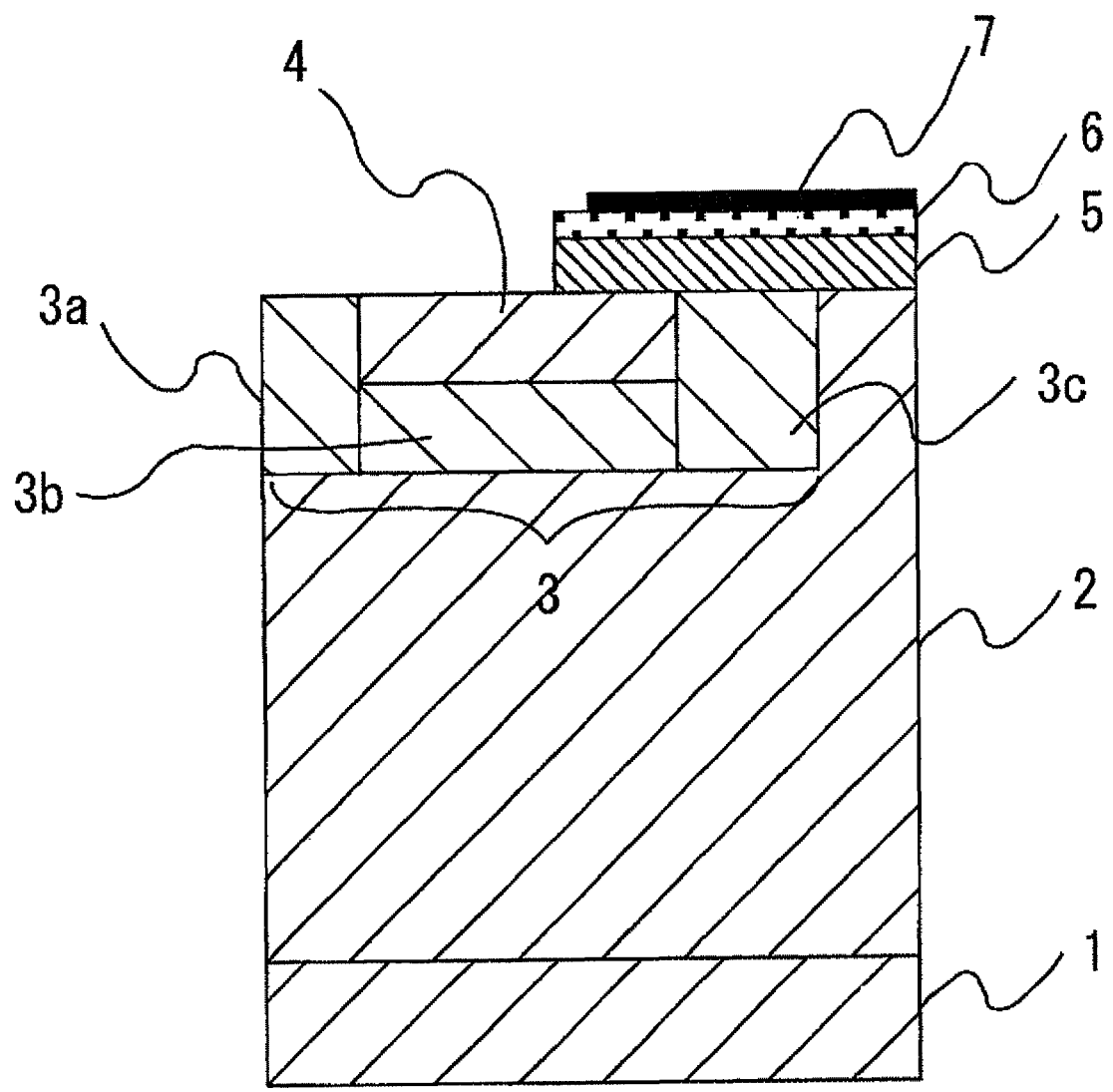

F I G . 1 0
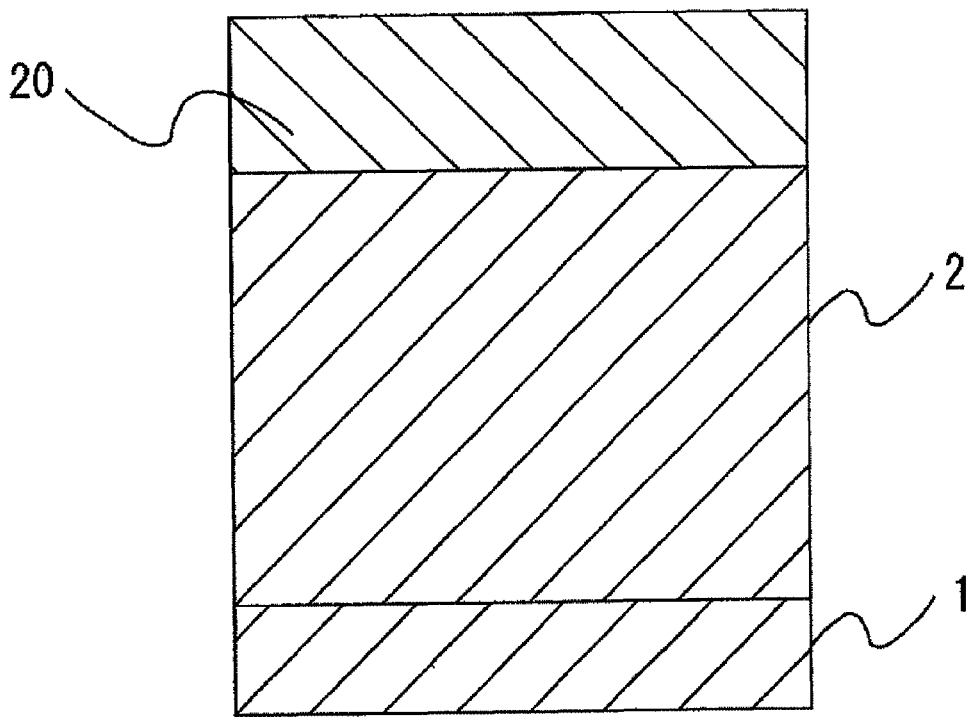
F I G . 1 1
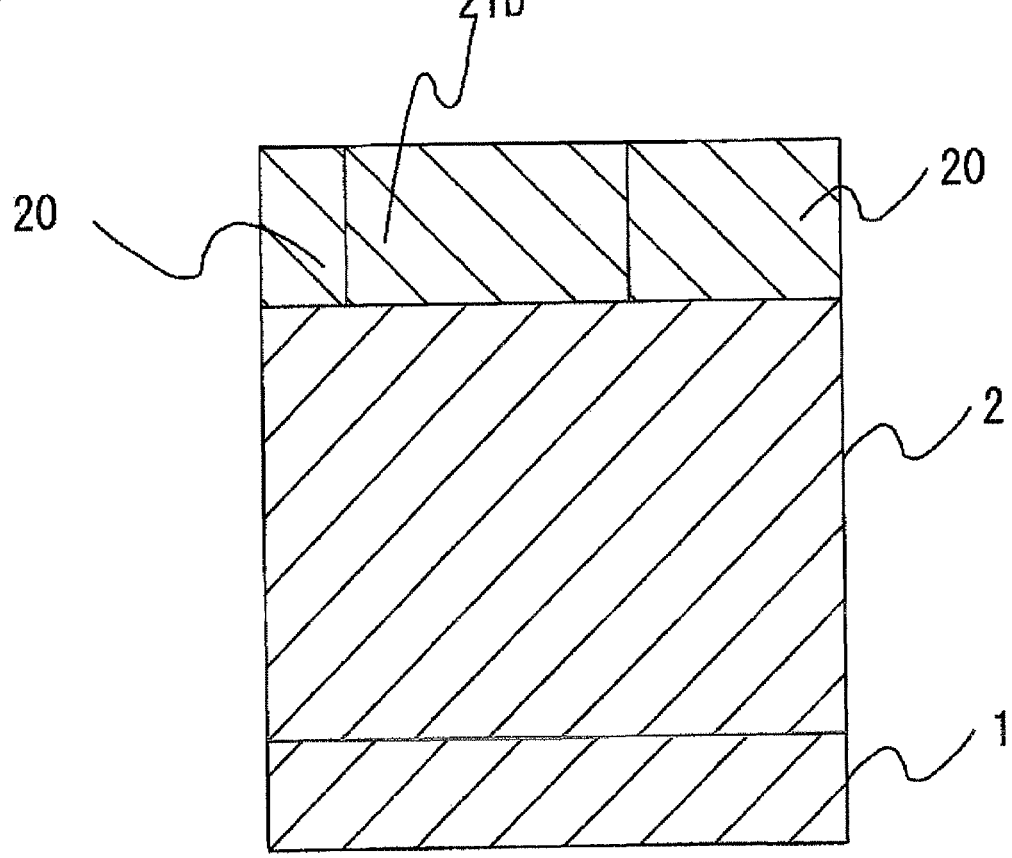

F I G . 1 3
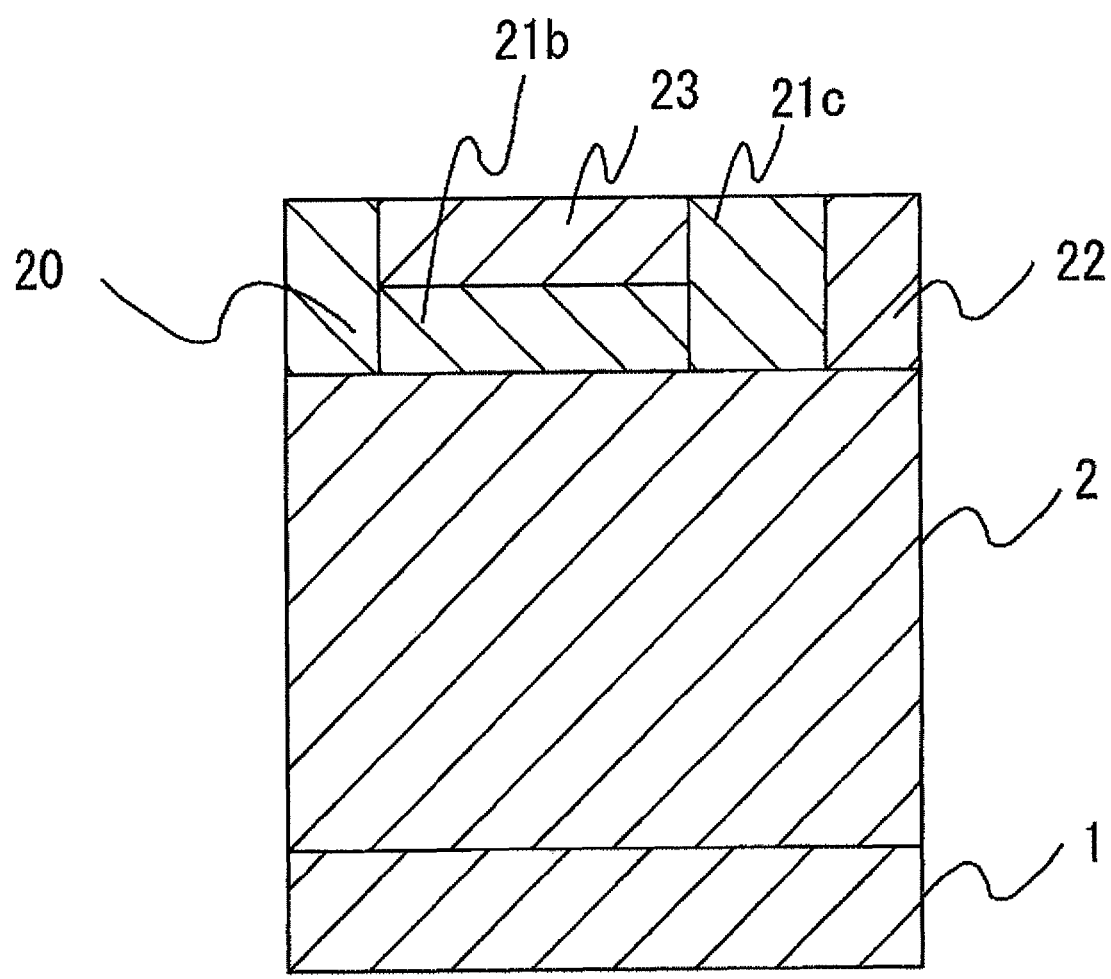

F I G . 1 5
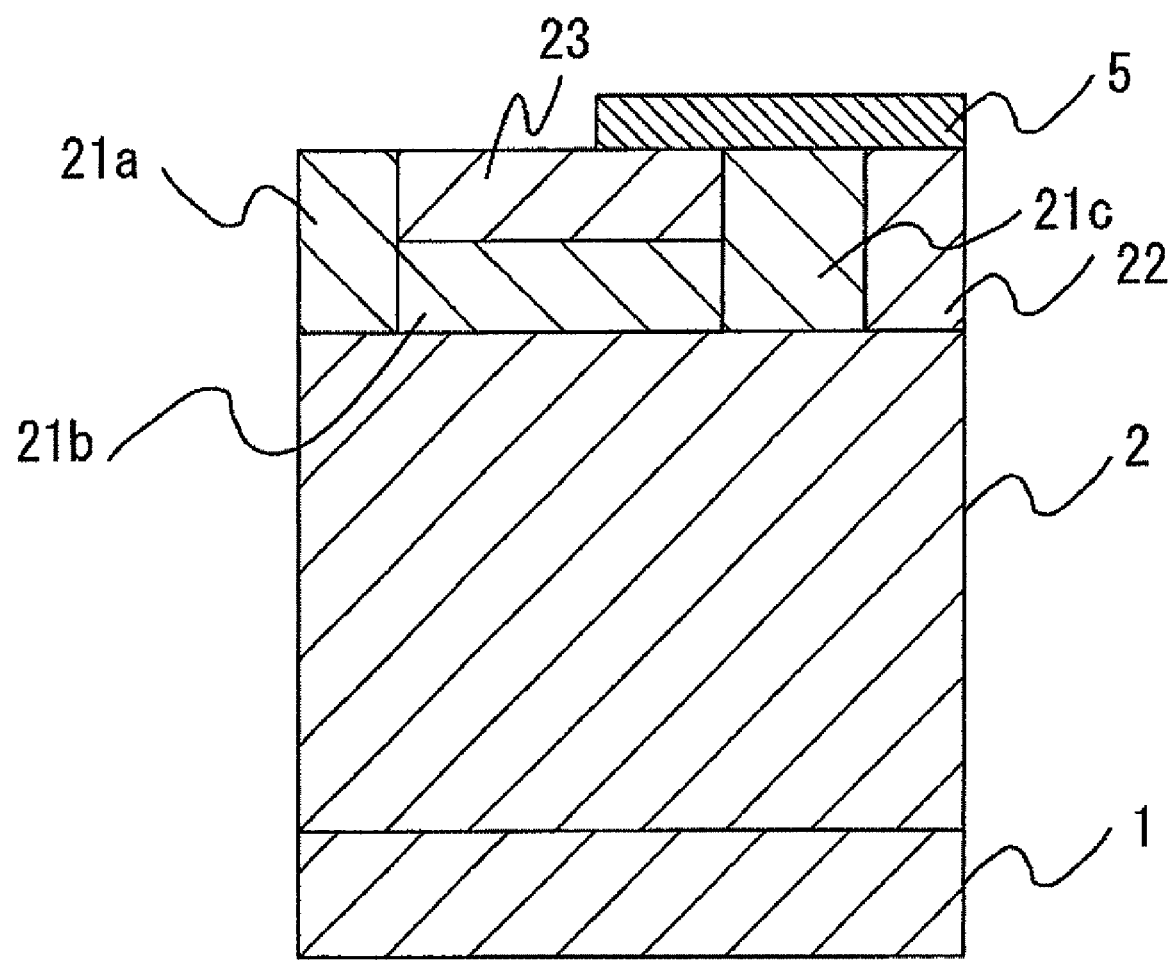

POWER SEMICONDUCTOR DEVICE HAVING RAISED CHANNEL AND MANUFACTURING METHOD THEREOF

TECHNICAL FIELD

The present invention relates to field-effect transistors having metal-oxide-silicon gate structures (hereinafter referred to as MOSFETs), and more particularly to high-power MOSFETs with improved on-state resistance and improved breakdown voltage, and to a manufacturing method thereof.

BACKGROUND ART

In recent years, the market scale of power semiconductors, such as IGBTs (Insulated gate bipolar transistors) and power MOSFETs, is expanding because of factors such as the electronization of control devices for automobiles, the proliferation of digital household appliances, and the use of inverter for energy consumption reduction of white goods. Researches are being conducted about the power semiconductors to improve their characteristics from the standpoint of energy consumption reduction. Especially, silicon carbide (hereinafter referred to as SiC) offers reduced on-state resistance because of its dielectric breakdown electric-field strength about ten times higher than that of silicon (hereinafter referred to as Si), and it also enables higher-temperature operations because of its large band width of 3 eV or more. Accordingly, the MOS (Metal-Oxide-Semiconductor) FETs using SiC are considered to be most promising as next-generation, high-voltage low-loss switching devices.

The MOS structure with Si is a well-known structure, but the structure using SiC has a problem of reduced channel mobility, because the oxide-semiconductor interface exhibits a larger interface state density when a thermal oxide film is used as the oxide. Accordingly, Patent Document 1 discloses a MOSFET structure manufactured by forming a drift layer on an SiC substrate, forming p-type base regions and n-type source regions by photolithography and ion implantation techniques, forming an n-type layer as a channel layer, and then forming a gate structure composed of a gate insulating film of, e.g. a thermal oxide, and a gate electrode. This makes it possible to reduce the influence of the oxide-semiconductor interface states on the carriers in the channel layer.

Also, the power semiconductors are required to perform normally-off operation in which no current flows between the source-drain when the gate voltage is zero, so as to ensure safe operation of the system. However, when an n-type layer is used as the channel layer as mentioned above, it is sometimes difficult to obtain normally-off conditions with good controllability. Accordingly, Patent Document 2 discloses a structure in which a normal p-type layer is operated in an inverted state (inversion MOS), and the document describes that the influence of the oxide-semiconductor interface states can be reduced by setting the concentration of the p-type region serving as the channel layer at $1 \times 10^{16}/cm^3$ or less.

Also, in order to achieve reduced on-state resistance and improved breakdown voltage which are indexes showing power device performance, it is effective to reduce device size and fabricate an increased number of devices per unit area. For this purpose, self-aligned manufacturing methods are proposed which are capable of accomplishing good controllability in forming the channel length determined by the dimensions of the p-type base region and n-type source region of the MOSFET. For example, Patent Document 3 discloses a method which uses a two-layered ion implantation mask and utilizes the spreading in ion implantation process so that a single implantation mask can be used instead of two independent implantation masks, and the dimensions can be controlled even when the channel length is as short as about 1 µm or less.

Patent Document 1: Japanese Patent Application Laid-Open No. 10-308510 (pp. 5-6, FIG. 1)

Patent Document 2: Japanese Patent Application Laid-Open No. 2000-150866 (pp 3-4, FIG. 1)

Patent Document 3: Japanese Patent Application Laid-Open No. 2004-363515 (p. 4, FIG. 1)

DISCLOSURE OF THE INVENTION

Problems to be Solved by the Invention

However, when a p-type base region and an n-type source region are formed in a self-aligned manner, the p-type impurity concentration in the p-type base region right under the channel layer tends to exhibit a smaller value than the p-type impurity concentration under the source region. In such a case, when a high voltage is applied between the source-drain, the p-type region right under the channel layer will be depleted and the breakdown voltage will be lowered. In particular, when the channel layer is n-type as shown in Patent Document 1, the p-type region right under the channel layer is depleted between the overlying channel layer and itself and then the characteristics will be further deteriorated.

Means for Solving the Problems

According to the present invention, a semiconductor device includes: a semiconductor substrate having a first conductivity type; a drift layer having the first conductivity type and formed on a main surface of said semiconductor substrate; a base region having a second conductivity type and formed in a predetermined portion of a surface portion of said drift layer, said base region having a predetermined depth; a source region having the first conductivity type and formed in a predetermined portion of a surface portion of said base region, said source region having a depth shallower than that of said base region; a channel layer having the second conductivity type and formed on a surface of said source region and said drift layer to connect said source region and said drift layer; an insulating film formed on a surface of said channel layer; a gate electrode formed on a surface of said insulating film; a source electrode formed on a surface of said base region and said source region; and a drain electrode formed on a lower surface of said semiconductor substrate.

EFFECTS OF THE INVENTION

The channel layer and the base region right under the channel layer are formed of the same conductivity type, so that the depletion layer produced in the base region right under the channel layer is reduced even when the device is formed in a self-aligned manner, and thus a high breakdown voltage is obtained. Also, since the device can be formed in a self-aligned manner, the device size can be reduced so that an increased number of devices can be fabricated in a certain area and the on-state resistance can be reduced.

BRIEF DESCRIPTION OF THE DRAWINGS

FIG. 7 A diagram illustrating part of the MOSFET manufacturing method of the first preferred embodiment of the present invention.

FIG. 10 A diagram illustrating part of a MOSFET manufacturing method according to a second preferred embodiment of the present invention.

FIG. 11 A diagram illustrating part of the MOSFET manufacturing method of the second preferred embodiment of the present invention.

FIG. 13 A diagram illustrating part of the MOSFET manufacturing method of the second preferred embodiment of the present invention.

FIG. 15 A diagram illustrating part of the MOSFET manufacturing method of the second preferred embodiment of the present invention.

DESCRIPTION OF THE REFERENCE CHARACTERS

1: n-type SiC substrate, 2: n-type SiC drift layer, 3: p-type SiC base region, 3a: p-type SiC region, 3b: p-type SiC region, 3c: p-type SiC region, 4: n-type SiC source region, 5: p-type SiC channel layer, 6: insulating film, 7: gate electrode, 8: source electrode, 9: drain electrode, 10: MOSFET, 11: n-type SiC depletion region

BEST MODE FOR CARRYING OUT THE INVENTION

First Preferred Embodiment

Figure 1:
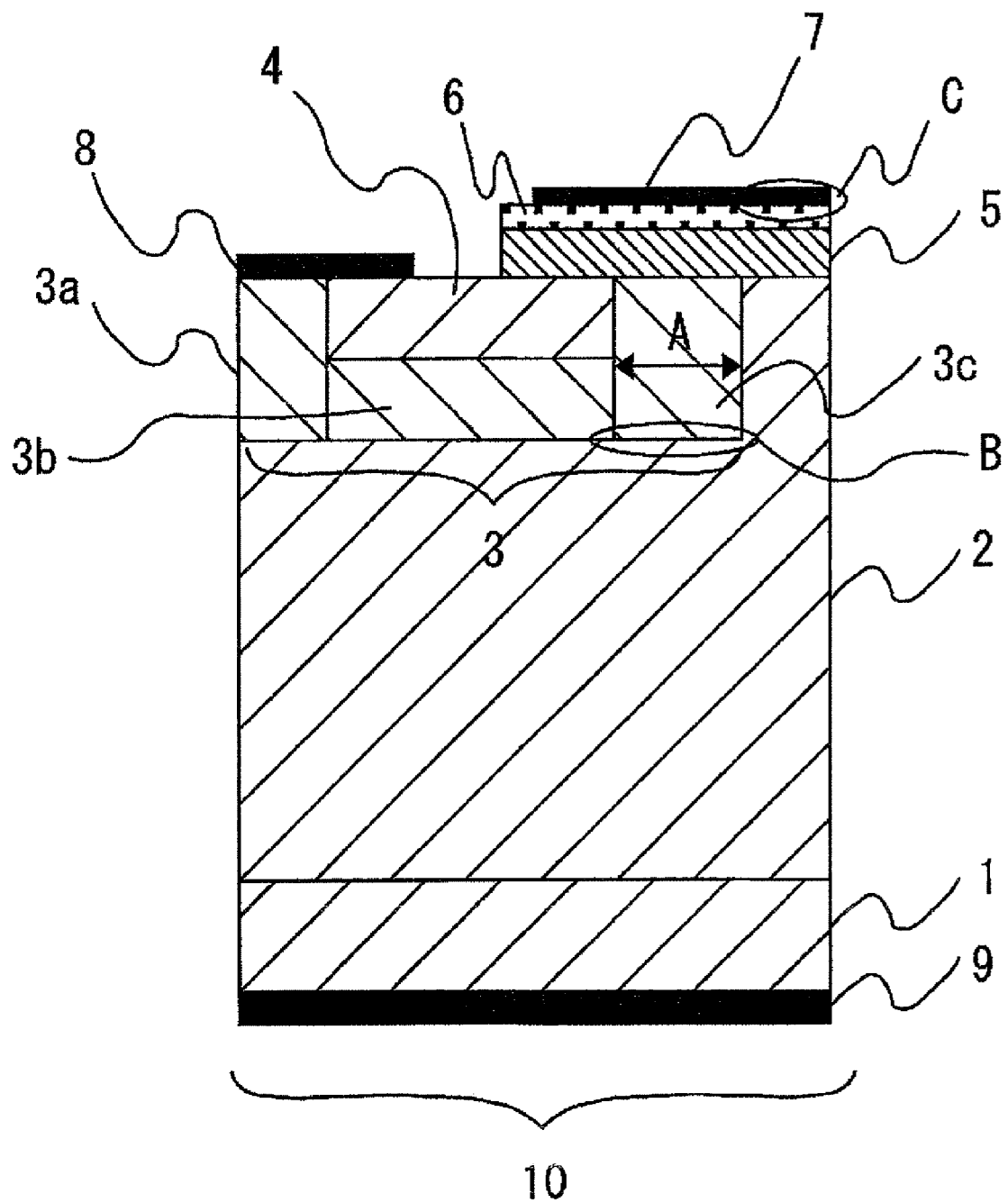
FIG. 1 A cross-sectional view illustrating a MOSFET according to a first preferred embodiment of the present invention.

Now, a MOSFET using SiC and its manufacturing method will be described according to a first preferred embodiment of the present invention. FIG. 1 is a cross-sectional view of the MOSFET of the first preferred embodiment. Note that in the real MOSFET structure, the cross-sectional structure of FIG. 1 is repeated symmetrically about the right side of the cross section of FIG. 1, and a plurality of such structures are sequentially arranged, with the electrodes of the same kinds connected in parallel.

First, the device structure of the MOSFET is described referring to FIG. 1. The MOSFET has an n-type SiC substrate 1 as a semiconductor substrate of a first conductivity type, and an n-type SiC drift layer 2 is formed on a main surface of the n-type SiC substrate 1 by epitaxial growth, as a drift layer of the first conductivity type that holds the breakdown voltage when a voltage is applied between the source-drain of the MOSFET. In a predetermined portion of the surface portion of the n-type SiC drift layer 2, a p-type SiC base region 3 is formed as a base region of a second conductivity type having a predetermined depth. In a predetermined portion of the surface portion of the p-type SiC base region 3, an n-type SiC source region 4 is formed as a source region of the first conductivity type having a smaller depth than the p-type SiC base region 3.

On a portion of the surface of the n-type SiC source region 4, a p-type SiC channel layer 5 is formed by epitaxial growth, as a channel layer of the second conductivity type that connects the n-type SiC source region 4 and the n-type SiC drift layer 2. An insulating film 6 is formed on the surface of the p-type SiC channel layer 5, by forming a silicon oxide film or a silicon oxynitride film or the like by thermal oxidation, nitridation, or insulating film deposition, or by a combination thereof. A gate electrode 7 is formed on the insulating film 6, a source electrode 8 is formed on another portion of the surface of the n-type SiC source region 4, and a drain electrode 9 is formed on the back of the n-type SiC substrate 1, whereby the MOSFET 10 is completed.

The p-type SiC base region 3 includes a p-type SiC region 3a formed under the source electrode 8 and having an increased concentration at least in its surface portion, a p-type SiC region 3b formed right under the n-type SiC source region 4 and having a lower impurity implantation concentration than the p-type SiC region 3a, and a p-type SiC region 3c formed right under the channel layer and having a lower impurity implantation concentration than the p-type SiC region 3b.

Next, the operation of the MOSFET 10 of the first preferred embodiment will be briefly described. In FIG. 1, when a positive voltage is applied to the gate electrode 7, the surface of the p-type SiC channel layer 5 is inverted to form a channel, whereby a current path is formed there. As a result, when a voltage is applied between the source electrode 8 and the drain electrode 9, the n-type SiC source region 4 and the n-type SiC drift layer 2 become conductive and a current flows between the source electrode 8 and the drain electrode 9. Thus, the MOSFET 10 performs switching operation as the voltage to the gate electrode 7 is turned on/off.

Figure 2:
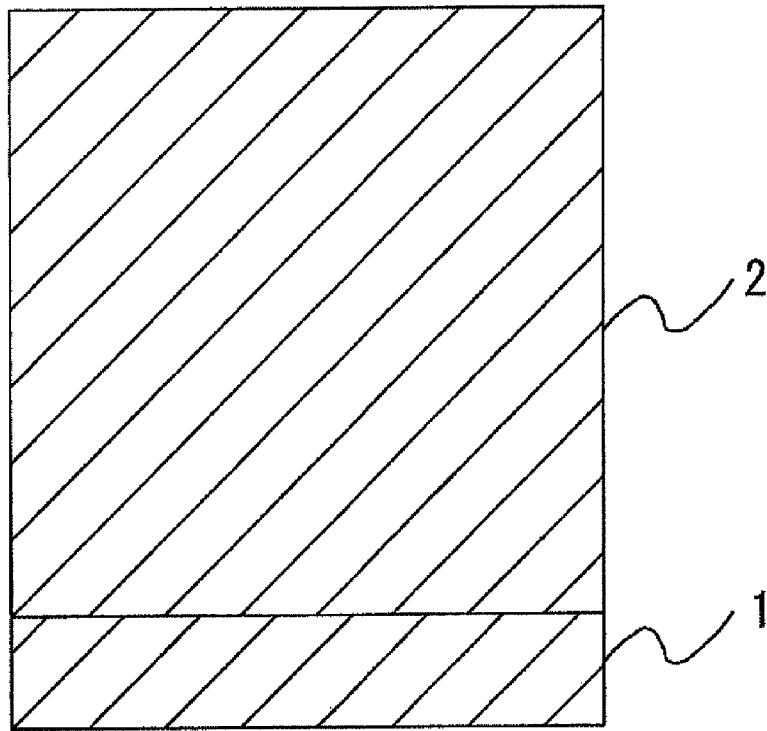
FIG. 2 A diagram illustrating part of a MOSFET manufacturing method according to the first preferred embodiment of the present invention.
Figure 3:
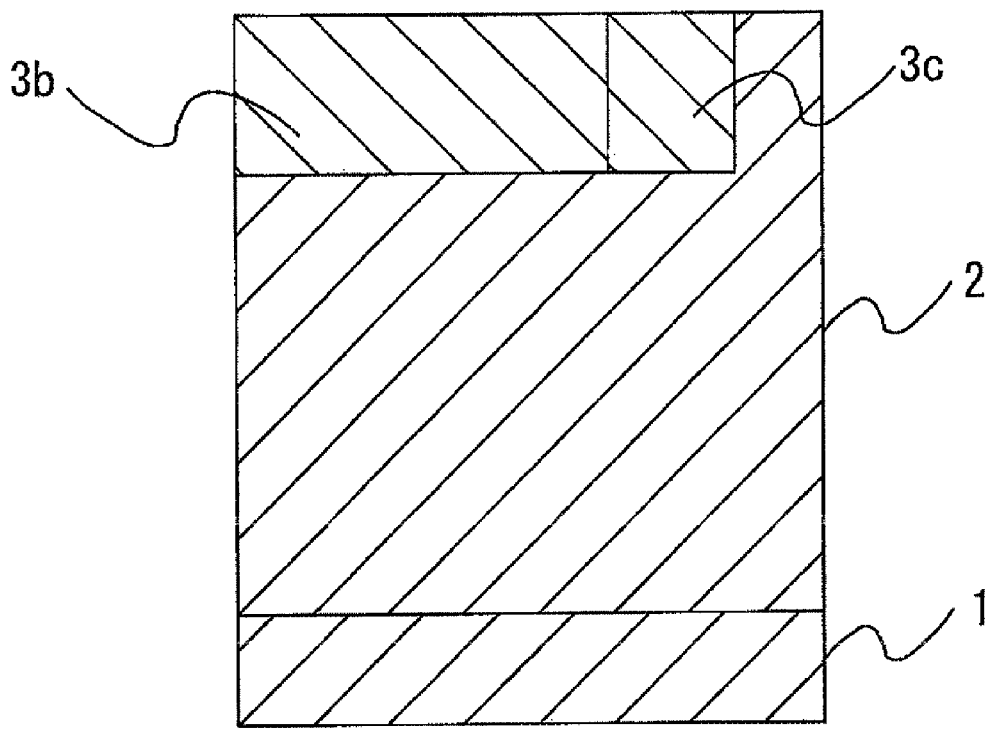
FIG. 3 A diagram illustrating part of the MOSFET manufacturing method of the first preferred embodiment of the present invention, FIG. 4 A diagram illustrating part of the MOSFET manufacturing method of the first preferred embodiment of the present invention.

Next, a method of manufacturing the MOSFET 10 of the first preferred embodiment will be described referring to FIGS. 2 to 8. First, the ntype SiC drift layer 2 is formed by epitaxial growth on the main surface of the n-type SiC substrate 1, with a doping concentration of $1 \times 10^{15}$ to $2 \times 10^{16}/cm^3$ and a layer thickness of 4 to 15 μm by CVD crystal growth, for example (FIG. 2). Next, the p-type SiC regions 3b and 3c of the p-type SiC base region 3 are formed in predetermined portions of the surface portion of the n-type SiC drift layer 2, with a doping concentration of $5 \times 10^{17}$ to $2 \times 10^{18}/cm^3$ and a layer thickness of about 0.7 to 1 μm (FIG. 3).

Figure 5:
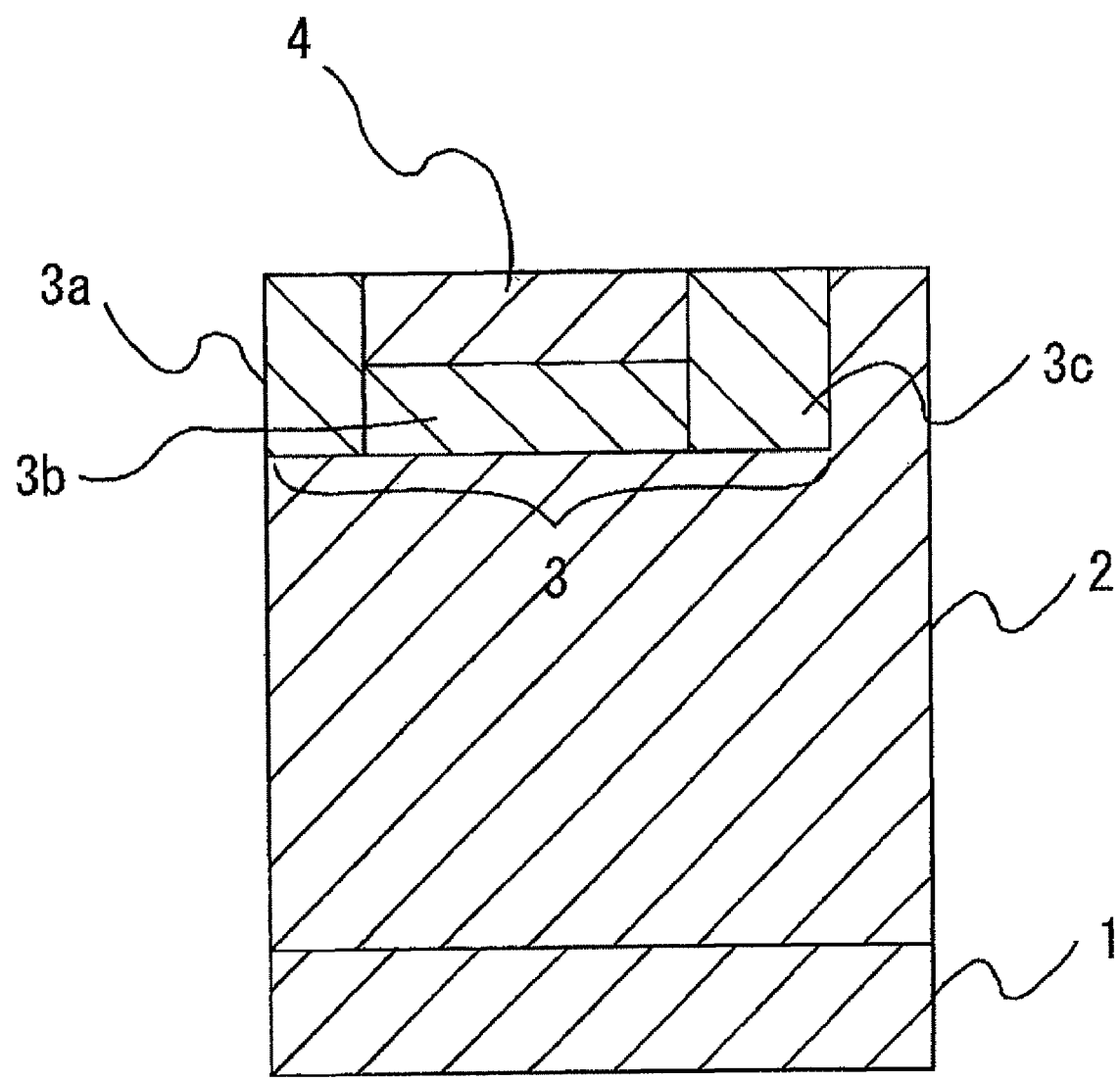
FIG. 5 A diagram illustrating part of the MOSFET manufacturing method of the first preferred embodiment of the present invention.

Next, in a surface portion of the p-type SiC region 3b, the n-type SiC source region 4 is formed to a doping concentration of $1 \times 10^{19}$ to $3 \times 10^{19}/cm^3$ and a layer thickness of about 0.2 to 0.4 μm (FIG. 4). Next, in a region adjacent the p-type SiC base region 3b, the p-type SiC region 3a of the p-type SiC base region 3 is formed so that it will be in contact with the source electrode 8, to a doping concentration of $5 \times 10^{18}$ to $1 \times 10^{20}/cm^3$ and a layer thickness of about 0.7 to 1 μm (FIG. 5). The p-type SiC base regions 3a, 3b, 3c and the n-type SiC source region 4 are formed by ion implantation and activating thermal treatment.

The formations of the p-type SiC regions 3b, 3c and the n-type SiC source region 4 may be achieved by using separate implantation masks, but they can be formed in a self-aligned manner with a single mask or with a structure obtained by processing a single mask, by using a two-layered implantation mask or oblique ion implantation process. In particular, when the channel length A shown in FIG. 1 is around 1 μm or less, it is preferable to form these regions in a self-aligned manner, because then they can be formed more precisely. In this case, in the p-type SiC base region 3, the p-type SiC region 3c is formed to a lower doping concentration or a smaller layer thickness than the p-type SiC region 3b.

Figure 6:
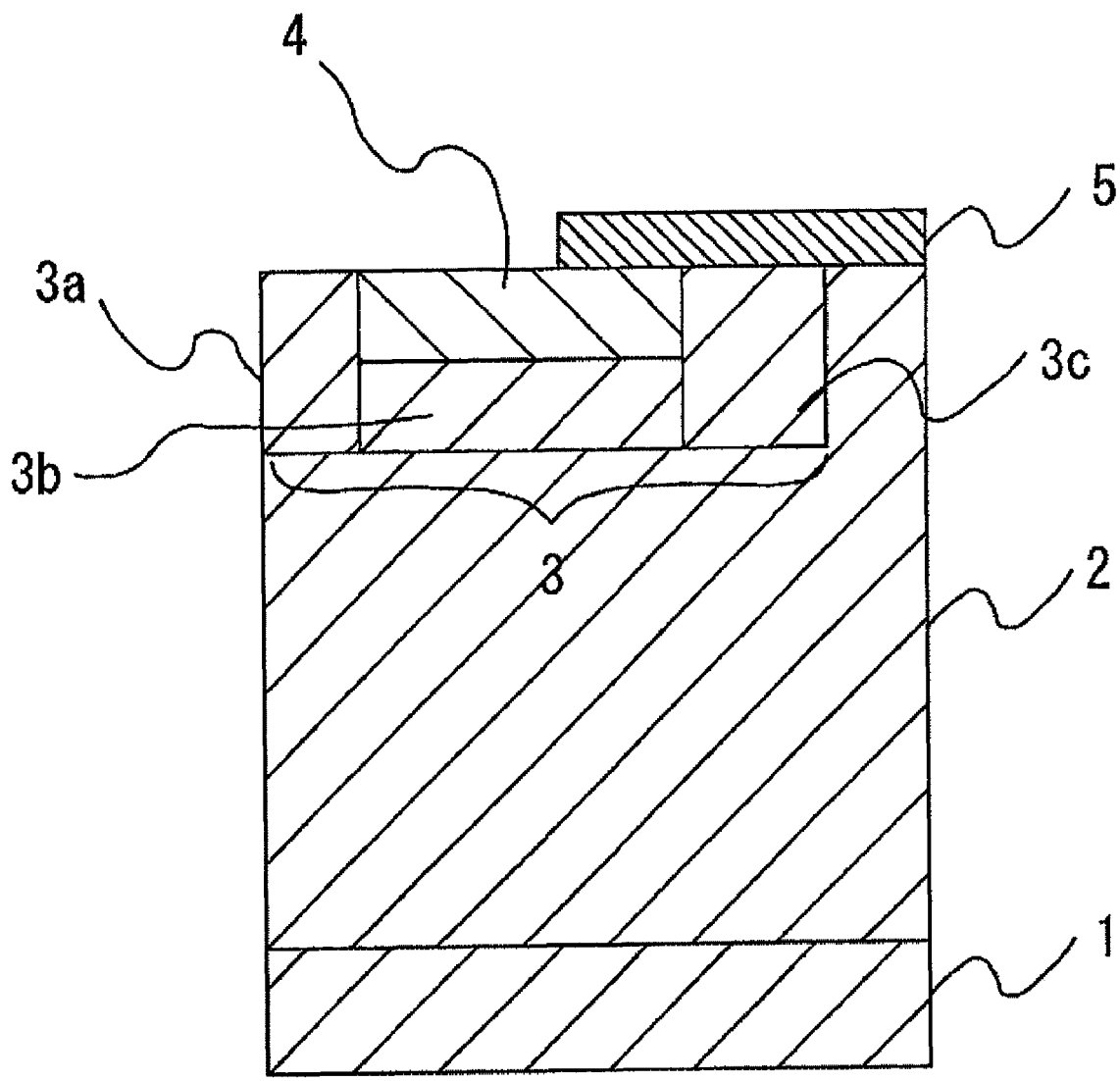
FIG. 6 A diagram illustrating part of the MOSFET manufacturing method of the first preferred embodiment of the present invention.
Figure 8:
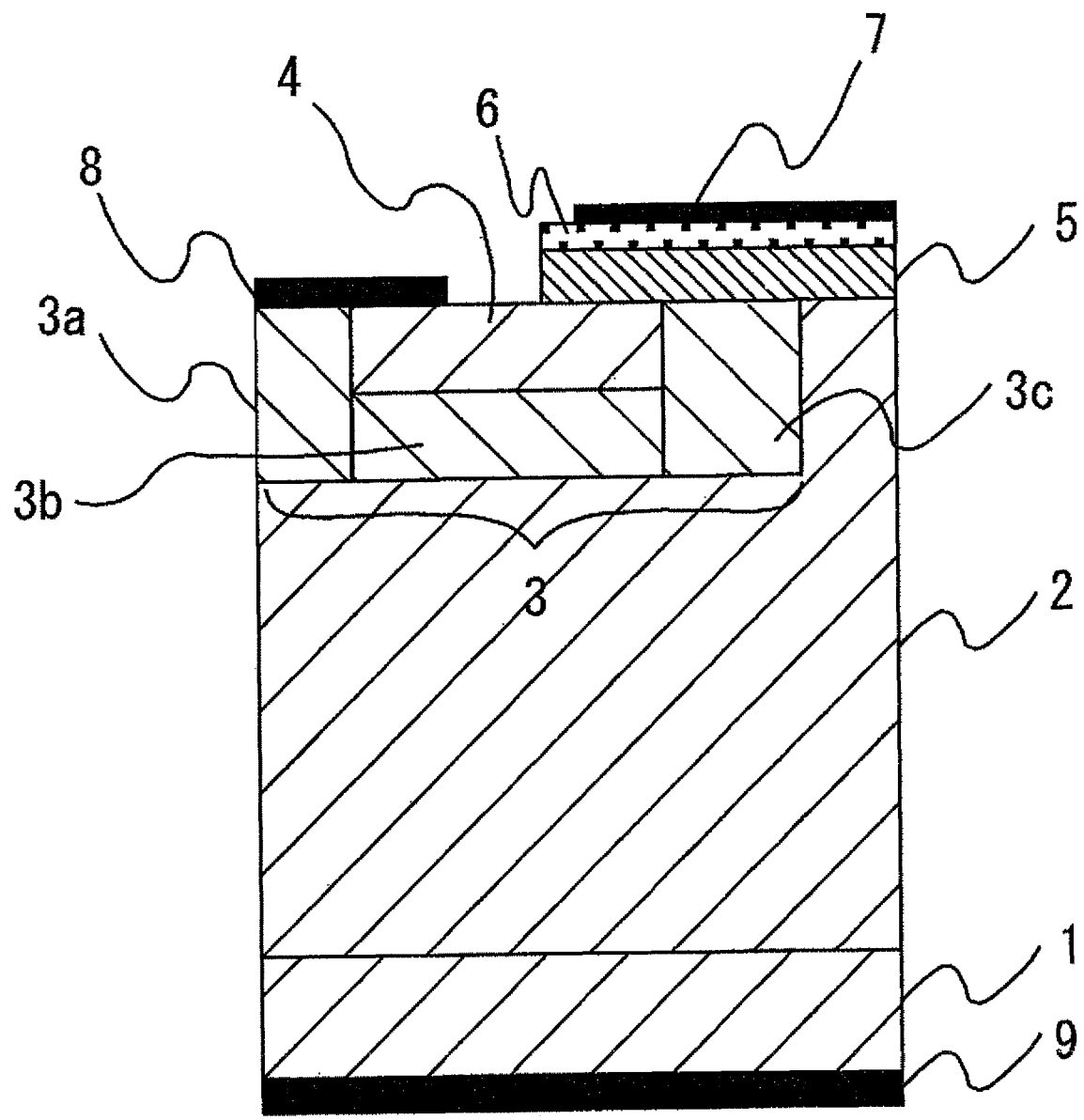
FIG. 8 A diagram illustrating part of the MOSFET manufacturing method of the first preferred embodiment of the present invention.

Next, on this structure, the p-type channel layer 5 is formed by epitaxial growth, with a doping concentration of $1 \times 10^{15}$ to $5 \times 10^{16}/cm^3$ and a layer thickness of about 0.1 to 1 μm. The surface is formed flat with a roughness smaller than 2 nm through the epitaxial growth (FIG. 6). Next, on the p-type channel layer 5, the gate insulating film 6 is formed, by forming a silicon oxide film or a silicon oxynitride film or the like by thermal oxidation, nitridation or insulating film deposition, or by a combination thereof, and then the gate electrode 7 is formed thereon (FIG. 7). Next, the source electrode 8 is formed on another portion of the surface of the n-type SiC source region 4, and the drain electrode 9 is formed on the back of the n-type SiC substrate 1, thereby completing the MOSFET 10 (FIG. 8).

Figure 9:
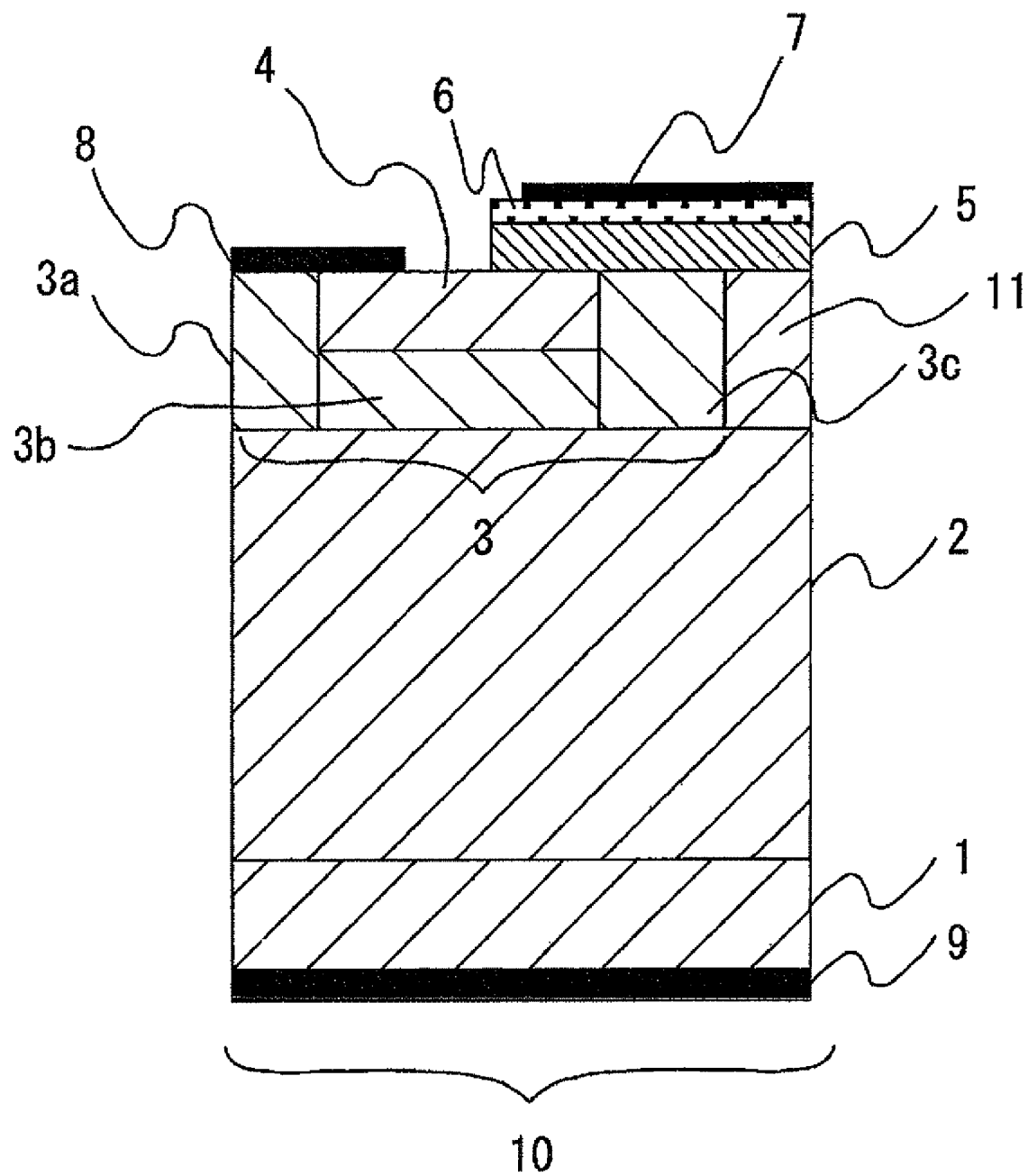
FIG. 9 A cross-sectional view illustrating the MOSFET of the first preferred embodiment of the present invention.

As shown in FIG. 9, in the n-type SiC drift layer 2, the p-type SiC base region 3 is absent in an n-type depletion region 11, and the doping concentration in the n-type depletion region 11 may be left as it is, or the n-type depletion region 11 may be provided with an increased n-type doping concentration by another ion implantation process.

In comparison with common inversion MOS, the p-type SiC base region 3 may be formed deeper by the thickness of the channel layer 5 of the first preferred embodiment, in order to enlarge the distance between the end C of the insulating film 6 and the end B of the pn junction formed by the p-type SiC region 3c and the n-type SiC drift layer 2, so as to lower the electric field value at the end C of the insulating film 6. However, in this case, the resistance component of the depletion region is increased due to the enlarged depth of the p-type SiC base region 3, and then the device resistance, i.e. steady-state loss, will increase. Also, when the thickness of the p-type SiC base region 3 is deeper than 1 μm, it is not preferable because the ion implantation process requires MeV-class acceleration voltage and the process to achieve self-alignment is complicated because of the necessities of changing the material of ion implantation mask and increasing its thickness.

As described above, in the MOSFET 10 of the first preferred embodiment, even with application of a voltage close to the ideal withstand voltage (around 500 to 2000 V) determined by the layer thickness and doping of the n-type SiC drift layer 2, it is possible to obtain a breakdown voltage close to the ideal withstand voltage without depletion, when the concentration of the p-type region 3c right under the channel region 5 is about $1 \times 10^{17}/cm^3$ or more which corresponds to about 5 to 20% of the concentration of the p-type SiC region 3b. In the technique of Patent Document 1 where the channel layer 5 is n-type unlike that of the first preferred embodiment, it is necessary that the concentration in the p-type SiC region 3c right under the channel layer be around $3 \times 10^{17}/cm^3$ or more which corresponds to about 15 to 50% of the concentration of the p-type SiC region 3b under the n-type SiC source region 4, and so forming the p-type SiC base region 3 and the n-type SiC source region 4 in a self-aligned manner requires precisely controlling the shape of mask and the range of ion implantation angles, which leads to increased manufacturing costs.

Also, in the MOSFET 10 of the first preferred embodiment, the p-type channel layer 5 is formed by epitaxial growth and the semiconductor surface is formed flat before the formation of the gate structure, and so the electron mobility in the channel layer is not lowered by scattering etc. that would be caused by roughness in the vicinity of the SiC surface. It is then possible to obtain a MOS structure with a superior inversion channel, and to obtain a sufficiently low-resistance channel characteristic. Furthermore, the inversion channel structure is advantageous because it facilitates obtaining normally-off operation in which no current flows between the source-drain when the gate voltage is zero.

Moreover, as to the electric field distribution in the device, when a high voltage is applied between the source-drain, the electric field is high at the end B of the pn junction formed by the p-type SiC base region 3 and the n-type SiC drift layer 2, and at the end C of the insulating film 6. Then, when the channel layer 5 is n-type, the electric field value at the end C of the insulating film 6 is reduced to about 70% as compared with a common inversion MOS structure having no channel layer, because the distance from the end B of the pn junction to the end C of the insulating film 6 is larger. Also, the electric field value at the end C of the insulating film 6 is further reduced when the channel layer 5 and the p-type SiC base region right underneath are of the same conductivity type as shown in the first preferred embodiment, where the electric field value at the end C of the insulating film 6 is about 60% as compared with that of a common inversion MOS having no channel layer, which offers further enhanced reliability of the insulating film 6.

Furthermore, by increasing the doping concentration of the n-type depletion region 11, the device resistance of the n-type depletion region 11 can be reduced even when the device dimensions are reduced and an increased number of MOSFETs are fabricated per unit area, which makes it possible to reduce the entire device resistance.

Second Preferred Embodiment

The first preferred embodiment has shown a MOSFET manufacturing method in which the p-type SiC base region 3 and the n-type SiC source region 4 are formed by ion implantation in the n-type SiC drift layer 2. A second preferred embodiment will illustrate another MOSFET manufacturing method referring to FIGS. 10 to 16.

First, as described in the first preferred embodiment, the n-type SiC drift layer 2 is formed by epitaxial growth on the main surface of the n-type SiC substrate 1. Next, a p-type SiC layer 20 is grown with a doping concentration of about $1 \times 10^{17}/cm^3$ or more over the entire surface portion of the n-type SiC drift layer 2 (FIG. 10).

Figure 12:
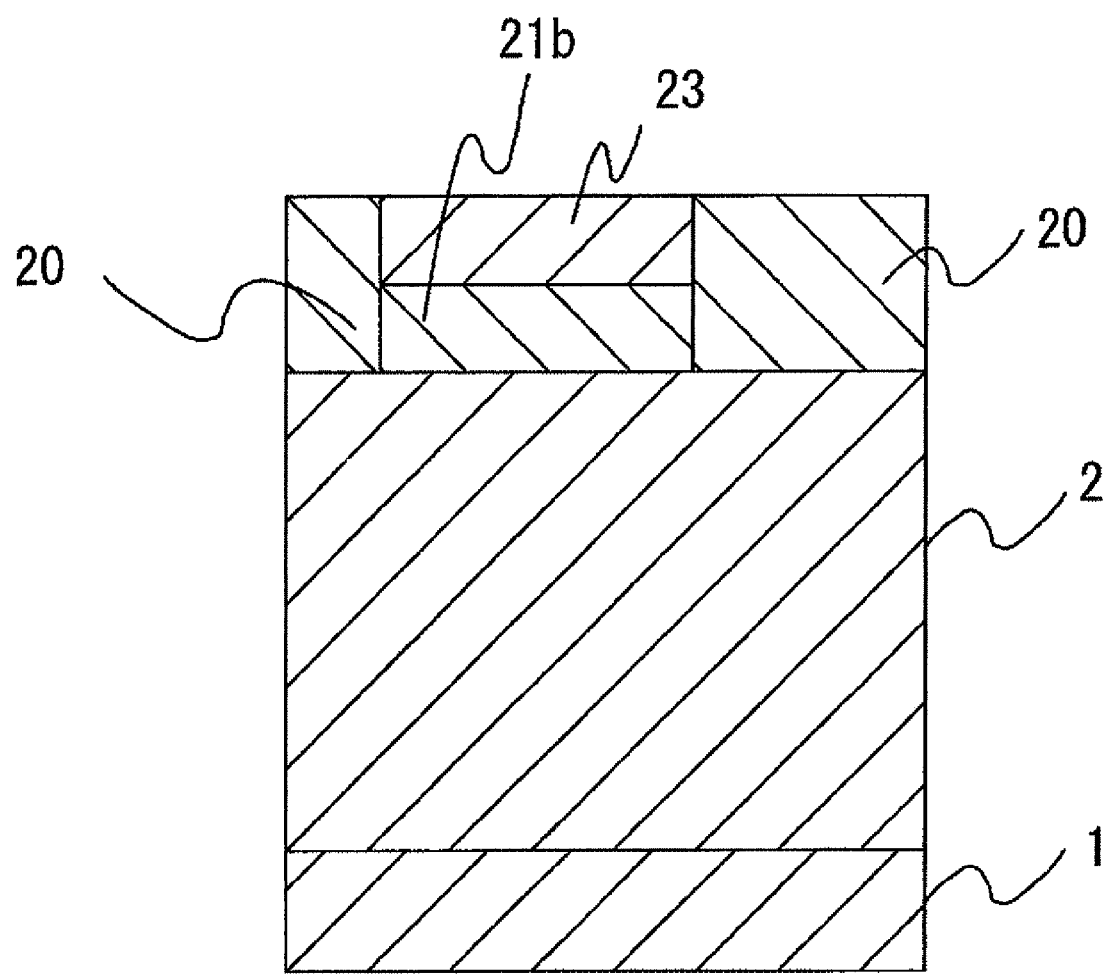
FIG. 12 A diagram illustrating part of the MOSFET manufacturing method of the second preferred embodiment of the present invention.

Next, in a predetermined portion of the surface portion of the p-type SiC layer 20, a p-type SiC region 21b of a p-type SiC base region 21 is formed, with a doping concentration of $5 \times 10^{17}$ to $2 \times 10^{18}/cm^3$ and a layer thickness of about 0.7 to 1 μm. In the p-type base region 21, the doping in a p-type SiC region 21c remains the same as that of the p-type SiC layer 20, and therefore its concentration is lower than that in the p-type SiC region 21b (FIG. 11). Next, in a surface portion of the p-type SiC region 21b, an n-type SiC source region 23 is formed to a doping concentration of $1\times10^{19}$ to $3\times10/cm^3$ and a layer thickness of about 0.2 to 0.4 μm, by using the ion implantation mask used to form the p-type SiC region 21b (FIG. 12).

Figure 14:
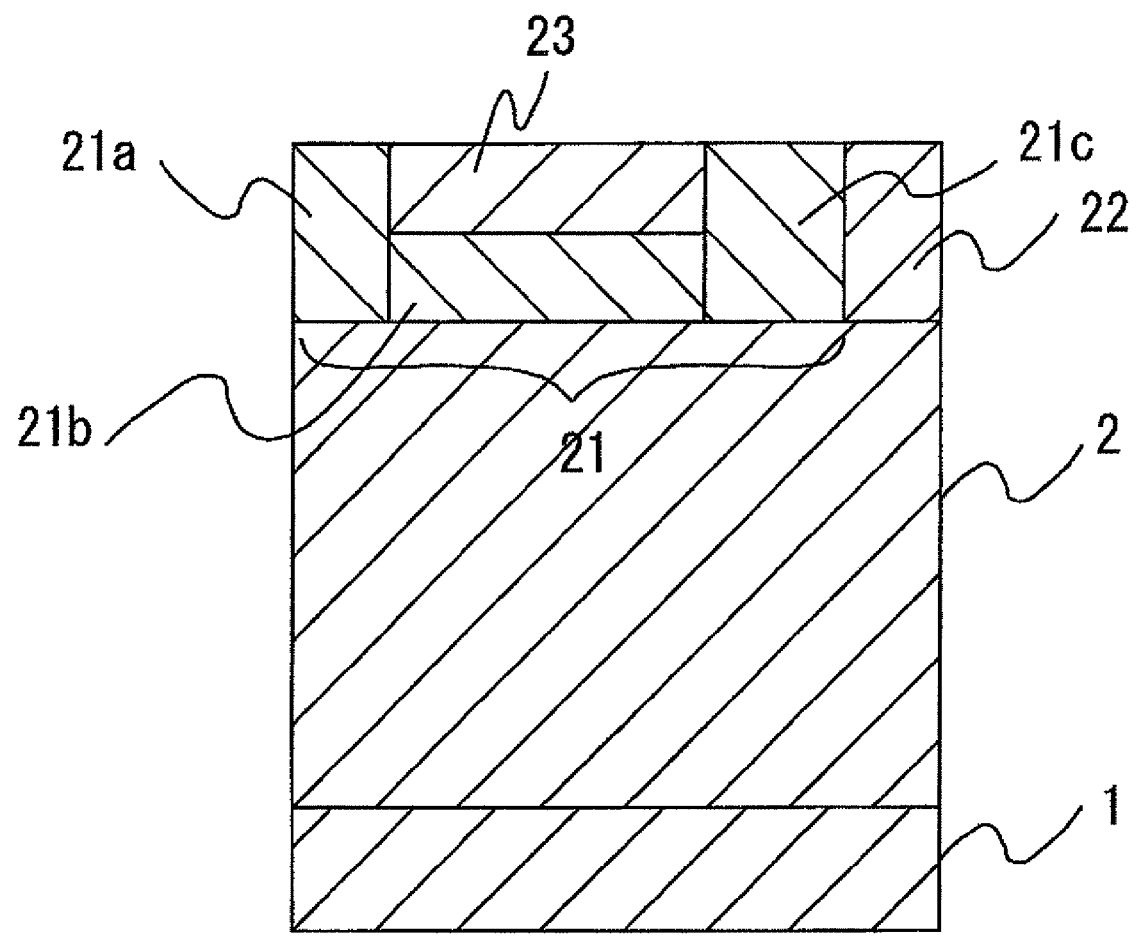
FIG. 14 A diagram illustrating part of the MOSFET manufacturing method of the second preferred embodiment of the present invention.

Next, in a predetermined portion of the surface portion of the p-type SiC layer 20, an n-type SiC depletion region 22 is formed to reach the drift layer 2 (FIG. 13). Next, in a portion adjacent the n-type source region 23, ion implantation and activating thermal treatment are applied to a doping concentration of $5\times10^{18}$ to $1\times10^{20}/cm^3$ and a layer thickness of about 0.7 to 1 μm, so as to form a p-type SiC region 21a in the p-type base region 21 in such a way that it will be in contact with the source electrode 8 (FIG. 14). The base regions 21a and 21b, the source region 23, and the n-type SiC depletion region 22 are formed by ion implantation and activating thermal treatment.

Figure 16:
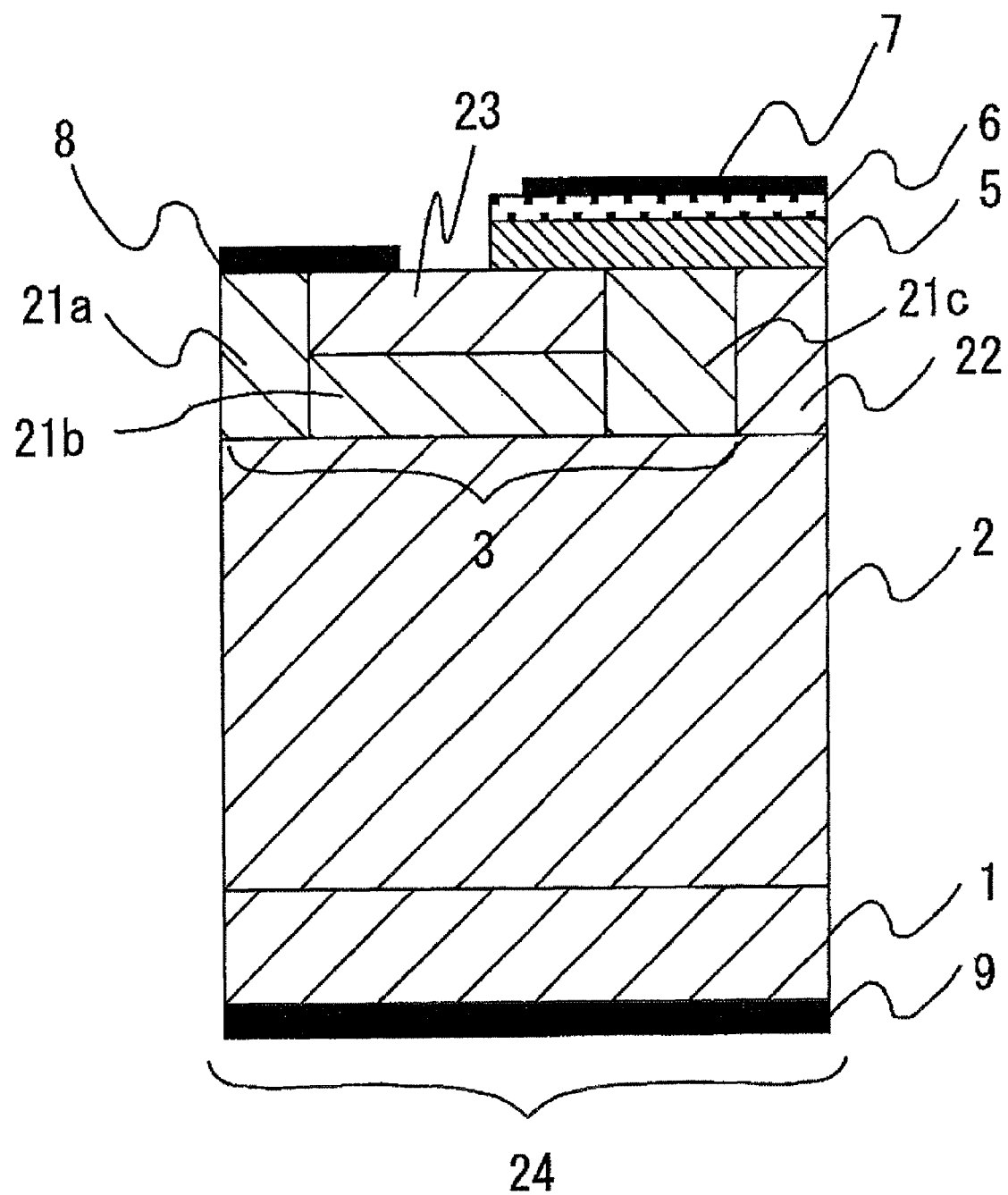
FIG. 16 A diagram illustrating part of the MOSFET manufacturing method of the second preferred embodiment of the present invention.

Next, on this structure, a p-type channel layer 5 is formed by epitaxial growth with a doping concentration of $1\times10^{15}$ to $5\times10^{16}$ cm$^3$ and a layer thickness of about 0.1 to 1 μm. The surface is made flat with a roughness smaller than 2 nm (FIG. 15). Next, on the p-type channel layer 5, an insulating film 6 is formed by forming a silicon oxide film or a silicon oxynitride film or the like by thermal oxidation, nitridation, or insulating film deposition, or by a combination thereof and a gate electrode 7 is formed thereon. Also, a source electrode 8 is formed on another surface portion of the n-type SiC source region 23, and a drain electrode 9 is formed on the back of the n-type SiC substrate 1, thereby completing a MOSFET 24 (FIG. 16).

As described above, in order to form the n-type SiC depletion region 22 with a higher doping concentration than the original doping concentration of the drift layer 2, the process requires ion implantation to (1) the p-type SiC base region and n-type SiC source region, (2) the contact region in the p-type SiC base region, and (3) the n-type SiC depletion region. In the first preferred embodiment, when the process of (1) is not self-aligned, the mask formation process for (1) has to be performed twice, and so the photolithography process for implantation mask formation has to be performed three or four times. In contrast, in the MOSFET 24 manufacturing method of the second preferred embodiment, the process of (1) does not require separately handling the p-type SiC base region and the n-type SiC source region, and so the photolithography process for implantation mask formation is always performed three times, and no self-aligned process is required. The MOSFET 24 manufactured by the method of the second preferred embodiment offers the same characteristics as the MOSFET 10 described in the first preferred embodiment.

In the MOSFETs described in the first and second preferred embodiments, the p-type SiC and n-type SiC may be exchanged. Also, while the MOSFETs described in the first and second preferred embodiments are composed of SiC semiconductor, the same effects can be obtained and semiconductor device performance can be improved by using wide band-gap semiconductor materials having band-gaps of about 2 eV or more, such as GaN, ZnO, diamond, etc.

What is claimed is:

1. A semiconductor device comprising:
   a semiconductor substrate having a first conductivity type and having main and lower surfaces;
   a drift layer, having the first conductivity type and a surface, said drift layer being located on the main surface of said semiconductor substrate;
   a base region having a second conductivity type and located within a portion of said drift layer, said base region having a depth in said drift layer and a surface;
   a source region having the first conductivity type and located within said base region at a portion of said base region, said source region having a depth shallower than the depth of said base region and a surface;
   a channel layer having the second conductivity type and located on and contacting the surface of said source region, and located on and contacting a part of the surface of said drift layer, with at least part of said source region located between said channel layer and said drift layer, for electrically connecting said source region to said drift layer via a channel produced in an on-state of said semiconductor device, the channel layer having a surface;
   an insulating film located on the surface of said channel layer, said insulating film having a surface;
   a gate electrode located on the surface of said insulating film;
   a source electrode located on the surface of said base region and the surface of said source region; and
   a drain electrode located on the lower surface of said semiconductor substrate.

2. The semiconductor device according to claim 1, wherein the first conductivity type is n-type and the second conductivity type is p-type.

3. The semiconductor device according to claim 1, wherein the first conductivity type is p-type and the second conductivity type is n-type.

4. The semiconductor device according to claim 1, wherein said channel layer of the second conductivity type is formed by epitaxial growth and the surface of said channel layer is flat.

5. The semiconductor device according to claim 1, wherein said base region of the second conductivity type and said source region of the first conductivity type are formed in a self-aligned manner.

6. The semiconductor device according to claim 1, wherein a portion of said drift layer of the first conductivity type adjoining said base region of the second conductivity type has a higher impurity concentration than elsewhere in said drift layer.

7. A method of manufacturing a semiconductor device comprising:
   forming a drift layer of a first conductivity type on a main surface of a semiconductor substrate of the first conductivity type, said drift layer having a surface;
   forming a base region of a second conductivity type within a portion of said drift layer at a first portion of the surface of said drift layer, but not at a second portion of the surface of said drift layer, said base region having a depth in said drift layer;
   forming a source region of the first conductivity type within a portion of said base region, said source region having a depth shallower than the depth of said base region;
   forming a channel layer of the second conductivity type by epitaxial growth on and contacting the surface of said source region and on and contacting the second portion of the surface of said drift layer so that at least part of said source region is located between said channel layer and said drift layer, said channel layer having a surface;
   forming an insulating film on the surface of said channel layer, said insulating film having a surface; and
   forming a gate electrode on the surface of said insulating film.

8. A method of manufacturing a semiconductor device comprising:
- forming a drift layer of a first conductivity type on a main surface of a semiconductor substrate of the first conductivity type;
- forming a layer of a second conductivity type having a surface and covering all of said drift layer;
- forming a base region of the second conductivity type within a portion of said layer of the second conductivity type, said base region having a depth in said layer of the second conductivity type;
- forming a source region of the first conductivity type within a portion of said base region, said source region having a depth shallower than the depth of said base region;
- forming a first conductivity type region in a portion of said layer of the second conductivity type, adjoining said base region, said first conductivity type region reaching said drift layer;
- forming, in a portion of said layer of the second conductivity type, at the surface of said layer of the second conductivity type, a region of the second conductivity type and having a higher impurity concentration than said base region for making contact to a source electrode;
- forming a channel region of the second conductivity type by epitaxial growth on and in contact with the surface of said source region and said first conductivity type region;
- forming an insulating film on the surface of said channel region, said insulating film having a surface; and
- forming a gate electrode on the surface of said insulating film.

* * * * *